United States Patent
Gill

(10) Patent No.: US 7,283,333 B2
(45) Date of Patent: Oct. 16, 2007

(54) SELF-PINNED DOUBLE TUNNEL JUNCTION HEAD

(75) Inventor: Hardayal Singh Gill, Palo Alto, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 415 days.

(21) Appl. No.: 10/777,647

(22) Filed: Feb. 11, 2004

(65) Prior Publication Data

US 2005/0174702 A1  Aug. 11, 2005

(51) Int. Cl.
*G11B 5/39* (2006.01)

(52) U.S. Cl. .................................... 360/324.1
(58) Field of Classification Search ............... 360/324, 360/324.1, 324.11, 324.2
See application file for complete search history.

(56) References Cited

U.S. PATENT DOCUMENTS

| | | | | |
|---|---|---|---|---|
| 5,018,037 | A | 5/1991 | Krounbi et al. ............. | 360/113 |
| 5,206,590 | A | 4/1993 | Dieny et al. ................. | 324/252 |
| 5,508,867 | A | 4/1996 | Cain et al. ................... | 360/113 |
| 5,650,958 | A | 7/1997 | Gallagher et al. ........... | 365/173 |
| 6,185,080 | B1 | 2/2001 | Gill ........................... | 360/324.2 |
| 6,275,363 | B1 | 8/2001 | Gill ........................... | 360/324.2 |
| 6,519,124 | B1 | 2/2003 | Redon et al. ............... | 360/324.2 |
| 6,581,272 | B1* | 6/2003 | Li et al. .................... | 29/603.14 |
| 6,611,405 | B1 | 8/2003 | Inomata et al. ............. | 360/324.2 |
| 6,633,461 | B2 | 10/2003 | Gill ........................... | 360/314 |
| 6,785,102 | B2* | 8/2004 | Freitag et al. ............. | 360/324.11 |
| 6,961,224 | B2* | 11/2005 | Pinarbasi ................... | 360/324.11 |
| 2002/0044396 | A1 | 4/2002 | Amano et al. .............. | 360/324.2 |
| 2002/0135946 | A1 | 9/2002 | Gill ............................. | 360/314 |
| 2003/0030945 | A1 | 2/2003 | Heinonen et al. ........... | 360/324.2 |
| 2003/0179515 | A1* | 9/2003 | Pinarbasi ................... | 360/324.11 |
| 2003/0184919 | A1 | 10/2003 | Lin et al. .................... | 360/314 |
| 2003/0185046 | A1 | 10/2003 | Nishiyama et al. ......... | 365/158 |
| 2003/0197984 | A1 | 10/2003 | Inomata et al. ............. | 360/324.2 |
| 2003/0227722 | A1* | 12/2003 | Freitag et al. ............. | 360/324.11 |
| 2005/0128652 | A1* | 6/2005 | Freitag et al. ............. | 360/324.11 |

FOREIGN PATENT DOCUMENTS

| EP | 1085586 | 3/2001 |
|---|---|---|
| EP | 1285586 | 8/2002 |

\* cited by examiner

*Primary Examiner*—A. J. Heinz
*Assistant Examiner*—Mark Blouin
(74) *Attorney, Agent, or Firm*—Zilka-Kotab, PC

(57) ABSTRACT

A thin dual magnetic tunnel junction head having a free layer and first and second antiparallel (AP) pinned layer structures positioned on opposite sides of the free layer, each of the AP pinned layer structures including at least two pinned layers having magnetic moments that are self-pinned antiparallel to each other, the pinned layers of each AP pinned layer structure being separated by an AP coupling layer. A first barrier layer is positioned between the first AP pinned layer structure and the free layer. A second barrier layer is positioned between the second AP pinned layer structure and the free layer. The head does not have any antiferromagnetic layers, and so is much thinner than dual magnetic tunnel junction sensors heretofore known. As such, dual magnetic tunnel junction heads can be fabricated at a thickness of less than about 500 Å.

20 Claims, 7 Drawing Sheets

SELF-PINNED DOUBLE TUNNEL JUNCTION HEAD

FIELD OF THE INVENTION

The present invention relates to magnetic heads, and more particularly, this invention relates to a dual magnetic tunnel junction sensor with self pinned structures positioned outside first and second magnetic tunnel junction structures.

BACKGROUND OF THE INVENTION

The heart of a computer is a magnetic disk drive which includes a rotating magnetic disk, a slider that has read and write heads (also called writers and sensors), a suspension arm above the rotating disk and an actuator arm that swings the suspension arm to place the read and write heads over selected circular tracks on the rotating disk. The suspension arm biases the slider into contact with the surface of the disk when the disk is not rotating but, when the disk rotates, air is swirled by the rotating disk adjacent an air bearing surface (ABS) of the slider causing the slider to ride on an air bearing a slight distance from the surface of the rotating disk. When the slider rides on the air bearing the write and read heads are employed for writing magnetic impressions to and reading magnetic signal fields from the rotating disk. The read and write heads are connected to processing circuitry that operates according to a computer program to implement the writing and reading functions.

In high capacity disk drives, magnetoresistive (MR) read sensors, commonly referred to as MR heads, are the prevailing read sensors because of their capability to read data from a surface of a disk at greater track and linear densities than thin film inductive heads. An MR sensor detects a magnetic field through the change in the resistance of its MR sensing layer (also referred to as an "MR element") as a function of the strength and direction of the magnetic flux being sensed by the MR layer.

The conventional MR sensor operates on the basis of the anisotropic magnetoresistive (AMR) effect in which an MR element resistance varies as the square of the cosine of the angle between the magnetization in the MR element and the direction of sense current flow through the MR element. Recorded data can be read from a magnetic medium because the external magnetic field from the recorded magnetic medium (the signal field) causes a change in the direction of magnetization of the MR element, which in turn causes a change in resistance of the MR element and a corresponding change in the sensed current or voltage.

Another type of MR sensor is the giant magnetoresistance (GMR) sensor manifesting the GMR effect. In GMR sensors, the resistance of the GMR sensor varies as a function of the spin-dependent transmission of the conduction electrons between ferromagnetic layers separated by a non-magnetic layer (spacer) and the accompanying spin-dependent scattering which takes place at the interface of the ferromagnetic and non-magnetic layers and within the ferromagnetic layers.

GMR sensors using only two layers of ferromagnetic material (e.g., Ni—Fe) separated by a layer of non-magnetic material (e.g., copper) are generally referred to as spin valve (SV) sensors. In an SV sensor, one of the ferromagnetic layers, referred to as the pinned layer (reference layer), has its magnetization typically pinned by exchange coupling with an antiferromagnetic (e.g., NiO or Fe—Mn) layer. The pinning field generated by the antiferromagnetic layer should be greater than demagnetizing fields (about 200 Oe) at the operating temperature of the SV sensor (about 120° C.) to ensure that the magnetization direction of the pinned layer remains fixed during the application of external fields (e.g., fields from bits recorded on the disk). The magnetization of the other ferromagnetic layer, referred to as the free layer, however, is not fixed and is free to rotate in response to the field from the recorded magnetic medium (the signal field). U.S. Pat. No. 5,206,590 granted to Dieny et al., incorporated herein by reference, discloses a SV sensor operating on the basis of the GMR effect.

An exemplary high performance read head employs a spin valve sensor for sensing the magnetic signal fields from the rotating magnetic disk. FIG. 1A shows a prior art SV sensor 100 comprising a free layer (free ferromagnetic layer) 110 separated from a pinned layer (pinned ferromagnetic layer) 120 by a non-magnetic, electrically-conducting spacer layer 115. The magnetization of the pinned layer 120 is fixed by an antiferromagnetic (AFM) layer 130.

FIG. 1B shows another prior art SV sensor 150 with a flux keepered configuration. The SV sensor 150 is substantially identical to the SV sensor 100 shown in FIG. 1A except for the addition of a keeper layer 152 formed of ferromagnetic material separated from the free layer 110 by a non-magnetic spacer layer 154. The keeper layer 152 provides a flux closure path for the magnetic field from the pinned layer 120 resulting in reduced magnetostatic interaction of the pinned layer 120 with the free layer 110. U.S. Pat. No. 5,508,867 granted to Cain et al. discloses a SV sensor having a flux keepered configuration.

Another type of SV sensor is an antiparallel (AP)-pinned SV sensor. In AP-Pinned SV sensors, the pinned layer is a laminated structure of two ferromagnetic layers separated by a non-magnetic coupling layer such that the magnetizations of the two ferromagnetic layers are strongly coupled together antiferromagnetically in an antiparallel orientation. The AP-Pinned SV sensor provides improved exchange coupling of the antiferromagnetic (AFM) layer to the laminated pinned layer structure than is achieved with the pinned layer structure of the SV sensor of FIG. 1A. This improved exchange coupling increases the stability of the AP-Pinned SV sensor at high temperatures which allows the use of corrosion resistant antiferromagnetic materials such as NiO for the AFM layer.

Referring to FIG. 1C, an AP-Pinned SV sensor 180 typically comprises a free layer 182 separated from a laminated AP-pinned layer structure 185 by a nonmagnetic, electrically-conducting spacer layer 184. The magnetization of the laminated AP-pinned layer structure 220 is fixed by an AFM layer 196. The laminated AP-pinned layer structure 220 comprises a first ferromagnetic layer 192 and a second ferromagnetic layer 186 separated by an antiparallel coupling layer (APC) 190 of nonmagnetic material. The two ferromagnetic layers 192, 186 ($FM_1$ and $FM_2$) in the laminated AP-pinned layer structure 185 have their magnetization directions oriented antiparallel, as indicated by the arrows 194, 188 (arrows pointing out of and into the plane of the paper respectively).

As mentioned above, AP-Pinned SV sensors typically use an AFM layer in order to pin the magnetization so that the pinned layers do not move around when the head is reading data from the disk, upon application of external magnetic fields, etc. The AFM layers are typically very thick, on the order of 150-200 Å. Due to the large overall thickness, such sensors are typically not practical for use in applications where a thin head is desirable.

Another type of magnetic device currently under development is a magnetic tunnel junction (MTJ) device. The MTJ device has potential applications as a memory cell and as a magnetic field sensor. The MTJ device comprises two ferromagnetic layers separated by a thin, electrically insulating, tunnel barrier layer. The tunnel barrier layer is sufficiently thin that quantum-mechanical tunneling of charge carriers occurs between the ferromagnetic layers. The tunneling process is electron spin dependent, which means that the tunneling current across the junction depends on the spin-dependent electronic properties of the ferromagnetic materials and is a function of the relative orientation of the magnetizations of the two ferromagnetic layers. In the MTJ sensor, one ferromagnetic layer has its magnetization fixed, or pinned, and the other ferromagnetic layer has its magnetization free to rotate in response to an external magnetic field from the recording medium (the signal field). When an electric potential is applied between the two ferromagnetic layers, the sensor resistance is a function of the tunneling current across the insulating layer between the ferromagnetic layers. Since the tunneling current that flows perpendicularly through the tunnel barrier layer depends on the relative magnetization directions of the two ferromagnetic layers, recorded data can be read from a magnetic medium because the signal field causes a change of direction of magnetization of the free layer, which in turn causes a change in resistance of the MTJ sensor and a corresponding change in the sensed current or voltage. U.S. Pat. No. 5,650,958 granted to Gallagher et al., incorporated in its entirety herein by reference, discloses an MTJ sensor operating on the basis of the magnetic tunnel junction effect.

FIG. 2A shows a prior art MTJ sensor 200 comprising a first electrode 204, a second electrode 202, and a tunnel barrier layer 206. The first electrode 204 comprises a pinned layer (pinned ferromagnetic layer) 212, an antiferromagnetic (AFM) layer 214, and a seed layer 216. The magnetization of the pinned layer 212 is fixed through exchange coupling with the AFM layer 214. The second electrode 202 comprises a free layer (free ferromagnetic layer) 208 and a cap layer 210. The free layer 208 is separated from the pinned layer 212 by a nonmagnetic, electrically insulating tunnel barrier layer 206. In the absence of an external magnetic field, the free layer 208 has its magnetization oriented in the direction shown by arrow 220, that is, generally perpendicular to the magnetization direction of the pinned layer 212 shown by arrow 218 (tail of an arrow pointing into the plane of the paper). A first lead 222 and a second lead 224 formed in contact with first electrode 204 and second electrode 202, respectively, provide electrical connections for the flow of sensing current Is from a current source 226 to the MTJ sensor 200. Because the sensing current is perpendicular to the plane of the sensor layers, the MTJ sensor 200 is known as a current-perpendicular-to-plane (CPP) sensor. A signal detector 228, typically including a recording channel such as a partial-response maximum-likelihood (PRML) channel, connected to the first and second leads 222 and 224 senses the change in resistance due to changes induced in the free layer 208 by the external magnetic field.

FIG. 2B shows an air bearing surface (ABS) view, not to scale, of a dual magnetic tunnel junction (MTJ) sensor 230. The MTJ sensor 230 comprises end regions 234 and 236 separated from each other by a central region 232. The seed layer 244 is a layer deposited to modify the crystallographic texture or grain size of the subsequent layers, and may not be needed depending on the subsequent layer. A first MTJ stack deposited over the seed layer 244 comprises a first antiferromagnetic (AFM1) layer 246, a first AP-pinned layer 247, an electrically insulating tunnel barrier layer 254 and a first sense layer 255. The first AP-pinned layer 247 is formed of two ferromagnetic layers 248 and 252 separated by an antiparallel coupling (APC) layer 250. The APC layer is formed of a nonmagnetic material, preferably ruthenium (Ru) that allows the two ferromagnetic layers 248 and 252 to be strongly antiparallel-coupled together. The AFM1 layer 246 has a thickness at which the desired exchange properties are achieved, typically 100-300 Å.

A longitudinal bias stack sequentially deposited over the first MTJ stack comprises a first decoupling layer 259, a first ferromagnetic (FM1) layer 260, a third antiferromagnetic (AFM3) layer 262, a second ferromagnetic (FM2) layer 264 and a second decoupling layer 263. A second MTJ stack deposited over the longitudinal bias stack comprises a second sense layer 269, a second tunnel barrier layer 270, a second AP-pinned layer 271 and an antiferromagnetic (AFM2) layer 278. The second AP-pinned layer 271 is formed of two ferromagnetic layers 272 and 276 separated by an antiparallel coupling (APC) layer 274. The APC layer is formed of a nonmagnetic material, preferably ruthenium (Ru) that allows the two ferromagnetic layers 272 and 276 to be strongly antiparallel-coupled together. The AFM2 layer 278 has a thickness at which the desired exchange properties are achieved, typically 100-300 Å. A cap layer 280, formed on the AFM2 layer 278, completes the central region 236 of the dual SV sensor 230.

The AFM1 layer 246 is exchange-coupled to the first AP-pinned layer 247 to provide a pinning magnetic field to pin the magnetizations of the two ferromagnetic layers of the first AP-pinned layer perpendicular to the ABS as indicated by an arrow tail 249 and an arrow head 253 pointing into and out of the plane of the paper, respectively. The first sense layer 255 has a magnetization 257 that is free to rotate in the presence of an external (signal) magnetic field. The magnetization 257 of the first sense layer 255 is preferably oriented parallel to the ABS in the absence of an external magnetic field.

The AFM2 layer 278 is exchange-coupled to the second AP-pinned layer 271 to provide a pinning magnetic field to pin the magnetizations of the two ferromagnetic layers of the second AP-pinned layer perpendicular to the ABS as indicated by an arrow head 273 and an arrow tail 275 pointing out of and into the plane of the paper, respectively. The second sense layer 269 has a magnetization 267 that is free to rotate in the presence of an external (signal) magnetic field. The magnetization 267 of the second sense layer 269 is preferably oriented parallel to the ABS in the absence of an external magnetic field.

The AFM3 layer 262 is exchange-coupled to the FM1 layer 260 and the FM2 layer 264 to provide pinning fields to pin the magnetizations 261 and 265, respectively, parallel to the plane of the ABS. The magnetizations 261 and 265 provide longitudinal bias fields which form flux closures with the first and second sense layers 255 and 269, respectively, to stabilize the first and second sense layers 255 and 269.

A major drawback to the MTJ sensors described above is that the AFM layers result in a very thick structure that is not practical for use in modern high density magnetic storage systems.

There is a continuing need to increase the MR coefficient and reduce the thickness of sensors while improving sensor stability. An increase in signal variations in the sensing current and reduced sensor geometry equates to higher bit density (bits/square inch of the rotating magnetic disk) read by the read head.

SUMMARY OF THE INVENTION

The present invention provides a thin dual magnetic tunnel junction head that is practical for use in modern magnetic storage applications. The head includes a free layer and first and second antiparallel (AP) pinned layer structures positioned on opposite sides of the free layer, each of the AP pinned layer structures including at least two pinned layers having magnetic moments that are self-pinned antiparallel to each other, the pinned layers of each AP pinned layer structure being separated by an AP coupling layer. A first barrier layer is positioned between the first AP pinned layer structure and the free layer. A second barrier layer is positioned between the second AP pinned layer structure and the free layer. The head does not have any antiferromagnetic layers, and so is much thinner than dual magnetic tunnel junction sensors heretofore known. As such, dual magnetic tunnel junction heads can be fabricated at a thickness of less than about 500 Å.

The free layer may include a layer of NiFe, and preferably further includes layers of CoFe sandwiching the layer of NiFe. The inventor has also found that a thin free layer in this structure provides enhanced performance. Therefore, a preferred thickness of the free layer is less than about 30 Å, e.g., between about 15 and 25 Å.

In a preferred embodiment, the AP pinned layer structures have about the same magnetic thickness. Also preferably, a half voltage of the head is more than two times greater than a half voltage of a head having a substantially similar structure but having only one barrier layer.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

BEST MODE FOR CARRYING OUT THE INVENTION

The following description is the best embodiment presently contemplated for carrying out the present invention. This description is made for the purpose of illustrating the general principles of the present invention and is not meant to limit the inventive concepts claimed herein.

Figure 1A:
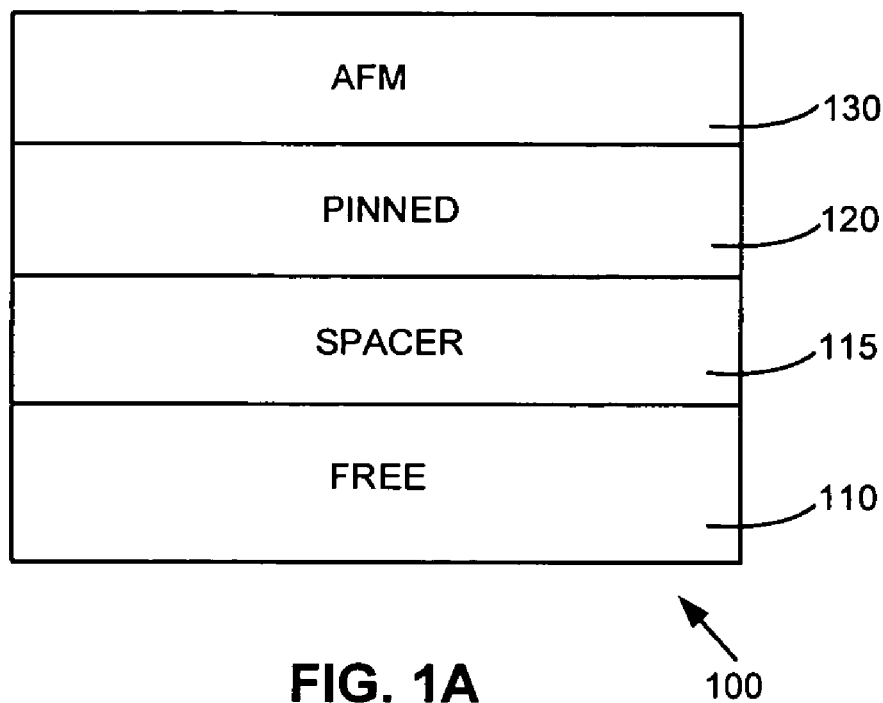
FIG. 1A is an air bearing surface view, not to scale, of a prior art spin valve (SV) sensor.
Figure 1B:
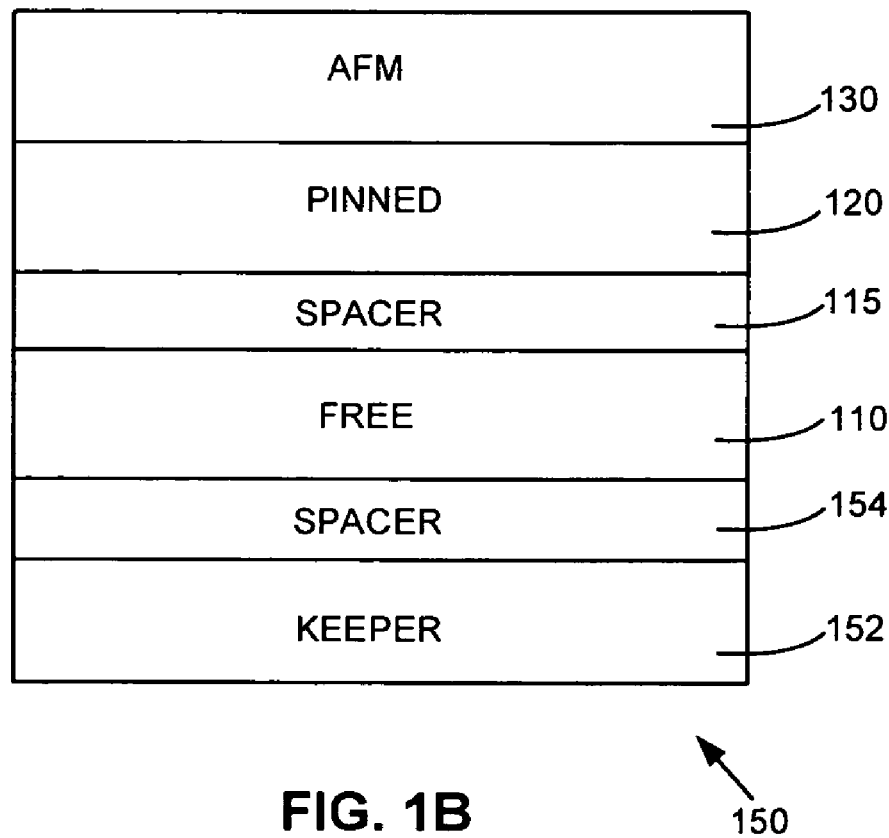
FIG. 1B is an air bearing surface view, not to scale, of a prior art keepered SV sensor.
Figure 1C:
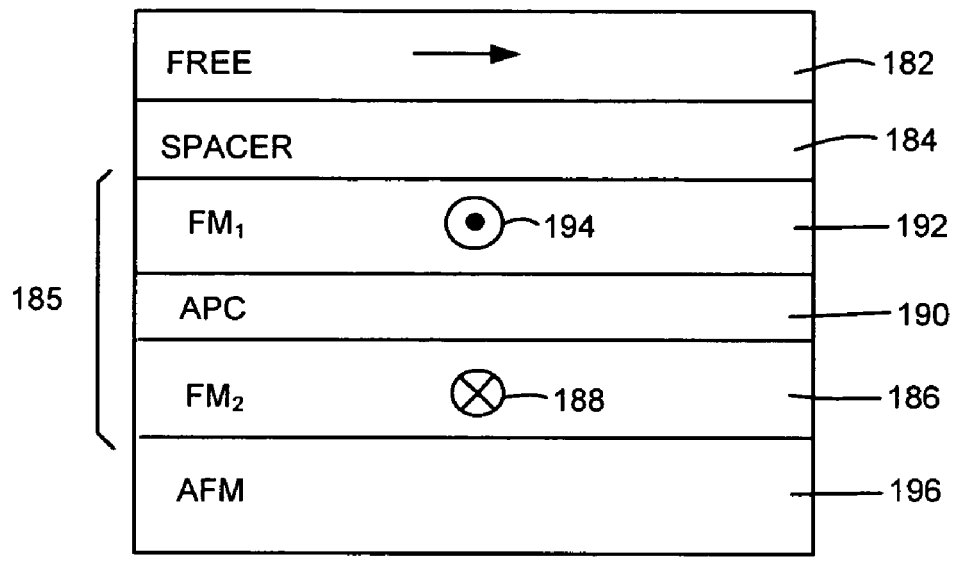
FIG. 1C is an air bearing surface view, not to scale, of a prior art AP-Pinned SV sensor.
Figure 2A:
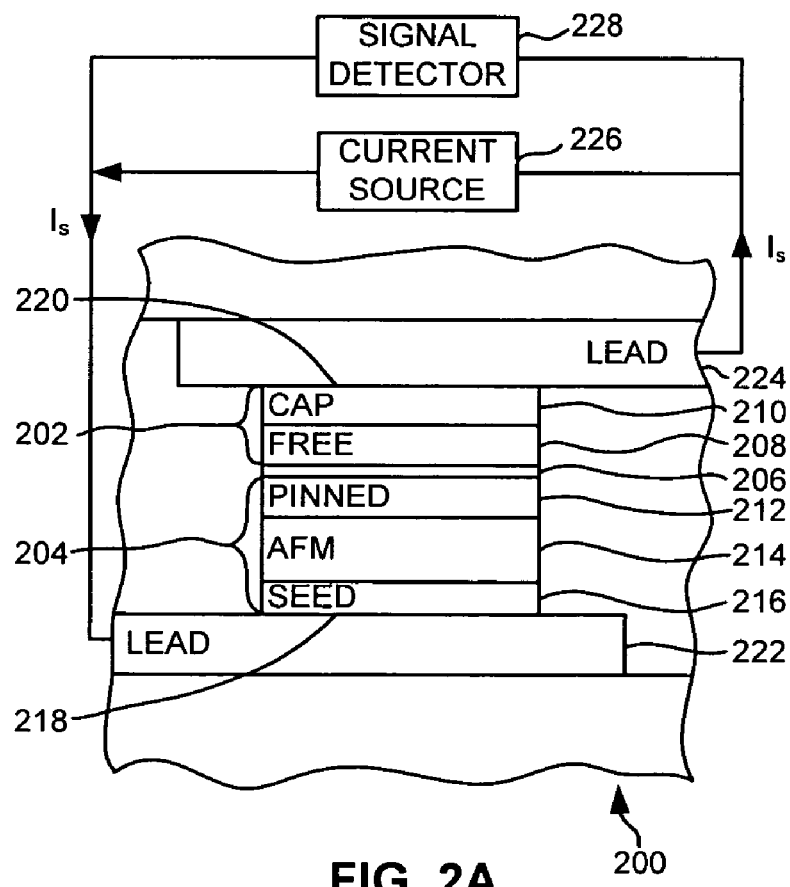
FIG. 2A is an air bearing surface view, not to scale, of a prior art magnetic tunnel junction sensor.
Figure 2B:
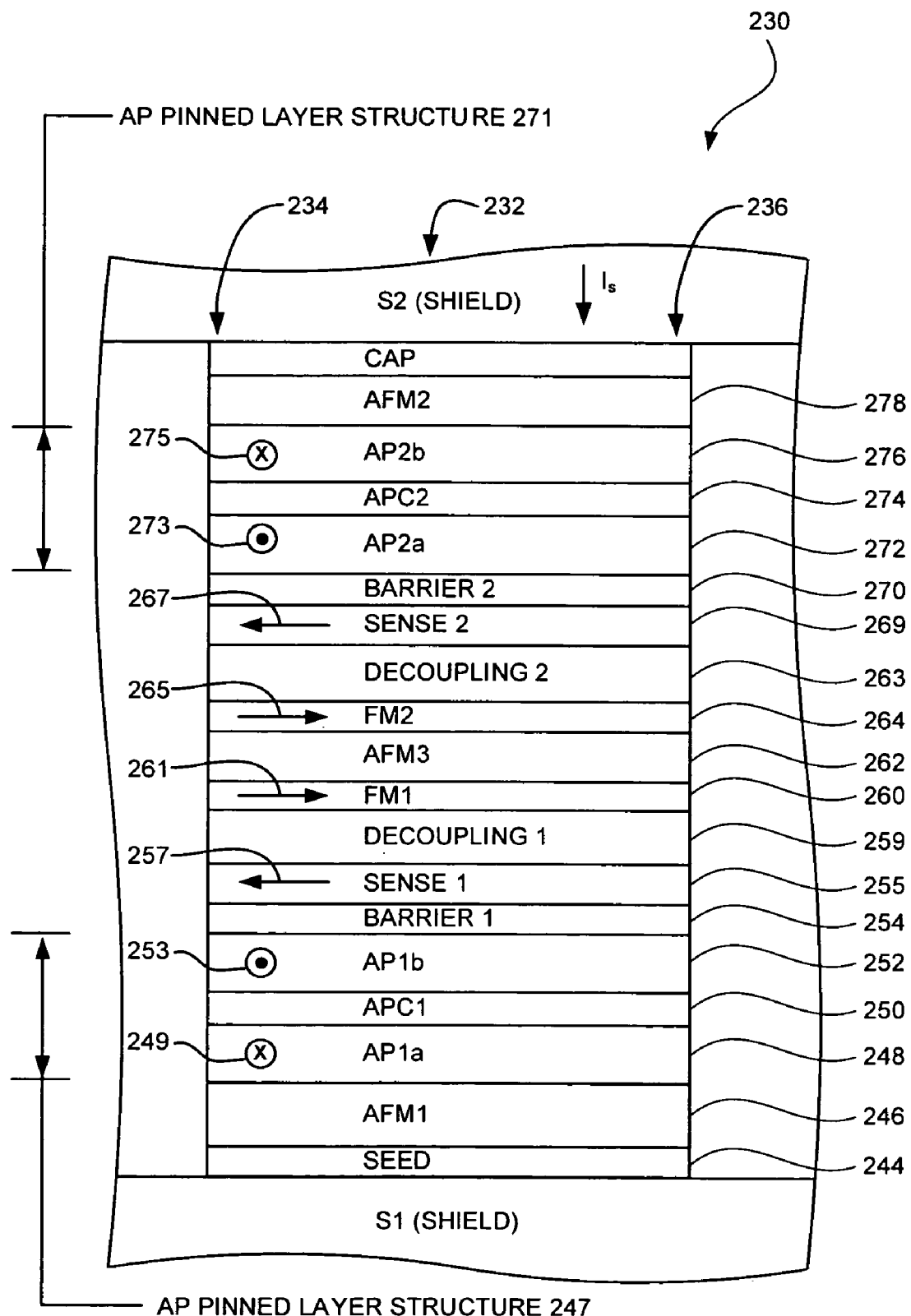
FIG. 2B is an air bearing surface view, not to scale, of a prior art dual magnetic tunnel junction (MTJ) sensor.
Figure 3:
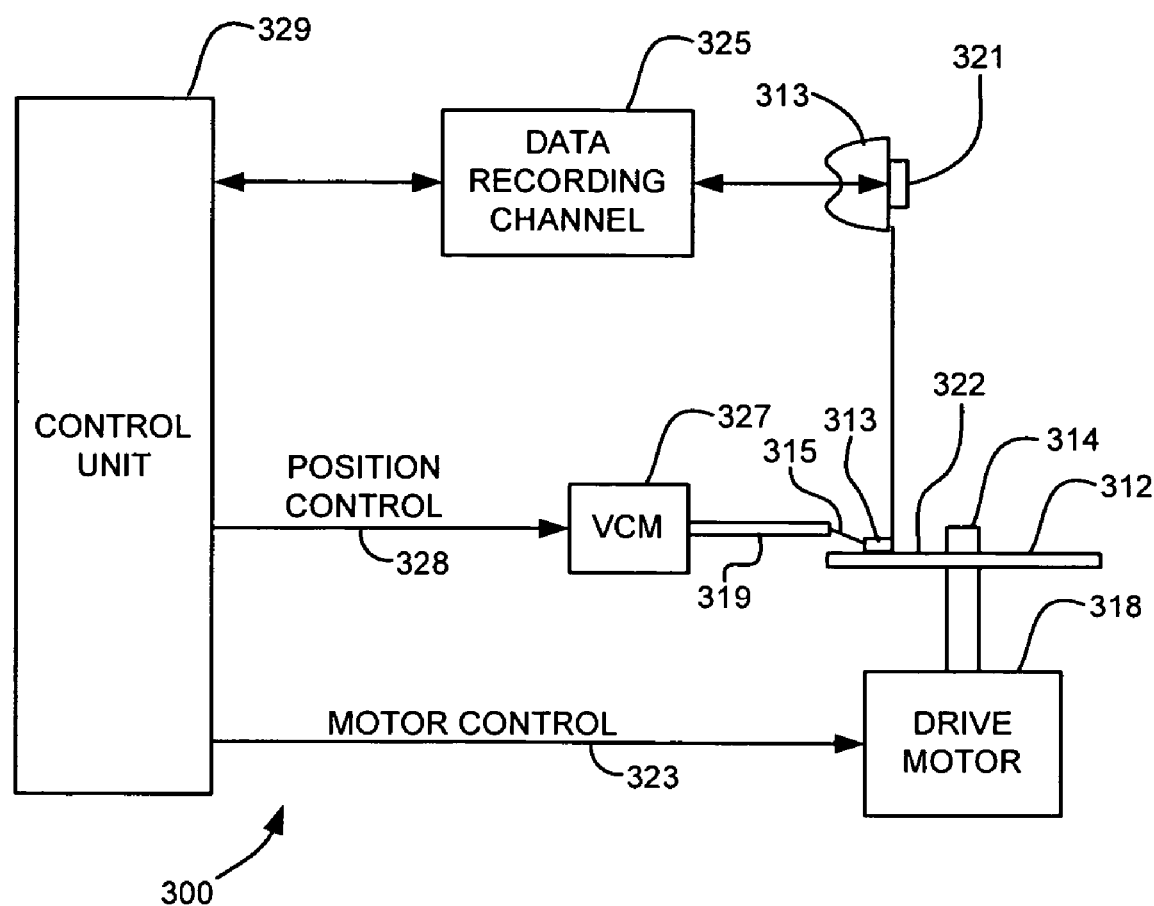
FIG. 3 is a simplified drawing of a magnetic recording disk drive system.

Referring now to FIG. 3, there is shown a disk drive 300 embodying the present invention. As shown in FIG. 3, at least one rotatable magnetic disk 312 is supported on a spindle 314 and rotated by a disk drive motor 318. The magnetic recording on each disk is in the form of an annular pattern of concentric data tracks (not shown) on the disk 312.

At least one slider 313 is positioned near the disk 312, each slider 313 supporting one or more magnetic read/write heads 321. More information regarding such heads 321 will be set forth hereinafter during reference to FIG. 4. As the disks rotate, slider 313 is moved radially in and out over disk surface 322 so that heads 321 may access different tracks of the disk where desired data are recorded. Each slider 313 is attached to an actuator arm 319 by means way of a suspension 315. The suspension 315 provides a slight spring force which biases slider 313 against the disk surface 322. Each actuator arm 319 is attached to an actuator means 327. The actuator means 327 as shown in FIG. 3 may be a voice coil motor (VCM). The VCM comprises a coil movable within a fixed magnetic field, the direction and speed of the coil movements being controlled by the motor current signals supplied by controller 329.

During operation of the disk storage system, the rotation of disk 312 generates an air bearing between slider 313 and disk surface 322 which exerts an upward force or lift on the slider. The air bearing thus counter-balances the slight spring force of suspension 315 and supports slider 313 off and slightly above the disk surface by a small, substantially constant spacing during normal operation.

The various components of the disk storage system are controlled in operation by control signals generated by control unit 329, such as access control signals and internal clock signals. Typically, control unit 329 comprises logic control circuits, storage means and a microprocessor. The control unit 329 generates control signals to control various system operations such as drive motor control signals on line 323 and head position and seek control signals on line 328. The control signals on line 328 provide the desired current profiles to optimally move and position slider 313 to the desired data track on disk 312. Read and write signals are communicated to and from read/write heads 321 by way of recording channel 325.

The above description of a typical magnetic disk storage system, and the accompanying illustration of FIG. 3 are for representation purposes only. It should be apparent that disk storage systems may contain a large number of disks and actuators, and each actuator may support a number of sliders.

Figure 4:
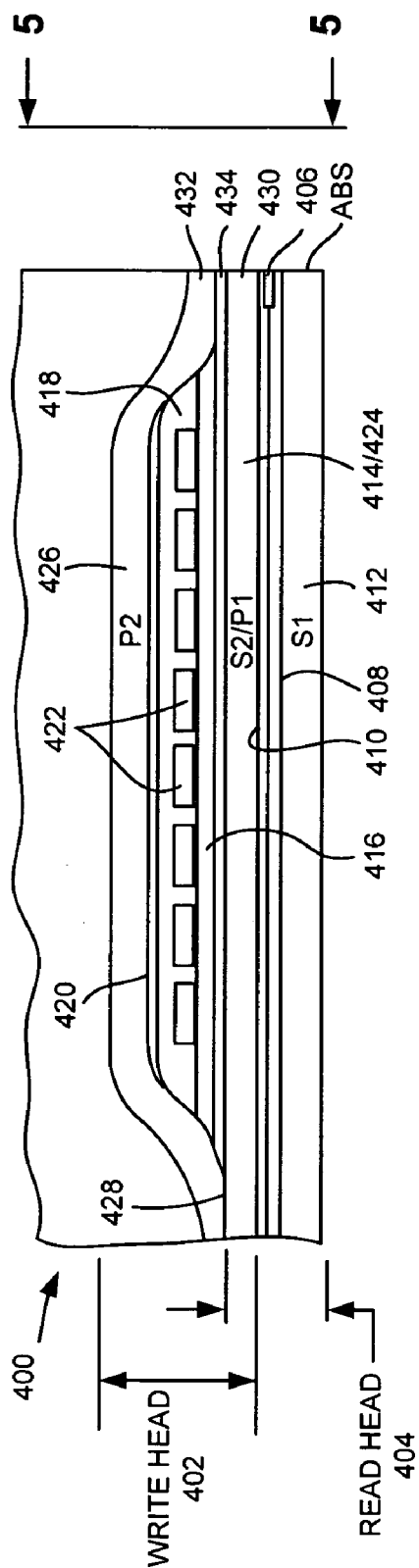
FIG. 4 is a partial view of the slider and a merged magnetic head.
Figure 5:
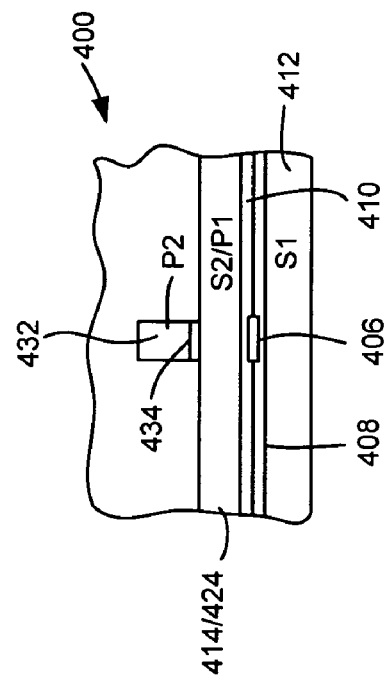
FIG. 5 is a partial ABS view, not to scale, of the slider taken along plane 5-5 of FIG. 4 to show the read and write elements of the merged magnetic head.

FIG. 4 is a side cross-sectional elevation view of a merged magnetic head 400, which includes a write head portion 402 and a read head portion 404, the read head portion employing a dual spin valve sensor 406 of the present invention. FIG. 5 is an ABS view of FIG. 4. The spin valve sensor 406 is sandwiched between nonmagnetic electrically insulative first and second read gap layers 408 and 410, and the read gap layers are sandwiched between ferromagnetic first and second shield layers 412 and 414. In response to external magnetic fields, the resistance of the spin valve sensor 406 changes. A sense current ($I_s$) conducted through the sensor causes these resistance changes to be manifested as potential changes. These potential changes are then processed as readback signals by the processing circuitry 329 shown in FIG. 3.

The write head portion 402 of the magnetic head 400 includes a coil layer 422 sandwiched between first and second insulation layers 416 and 418. A third insulation layer 420 may be employed for planarizing the head to eliminate ripples in the second insulation layer caused by the coil layer 422. The first, second and third insulation layers are referred to in the art as an "insulation stack". The coil layer 422 and the first, second and third insulation layers 416, 418 and 420 are sandwiched between first and second pole piece layers 424 and 426. The first and second pole piece layers 424 and 426 are magnetically coupled at a back gap 428 and have first and second pole tips 430 and 432 which are separated by a write gap layer 434 at the ABS. Since the second shield layer 414 and the first pole piece layer 424 are a common layer this head is known as a merged head. In a piggyback head an insulation layer is located between a second shield layer and a first pole piece layer. First and second solder connections (not shown) connect leads (not shown) from the spin valve sensor 406 to leads (not shown) on the slider 313 (FIG. 3), and third and fourth solder connections (not shown) connect leads (not shown) from the coil 422 to leads (not shown) on the suspension.

Figure 6:
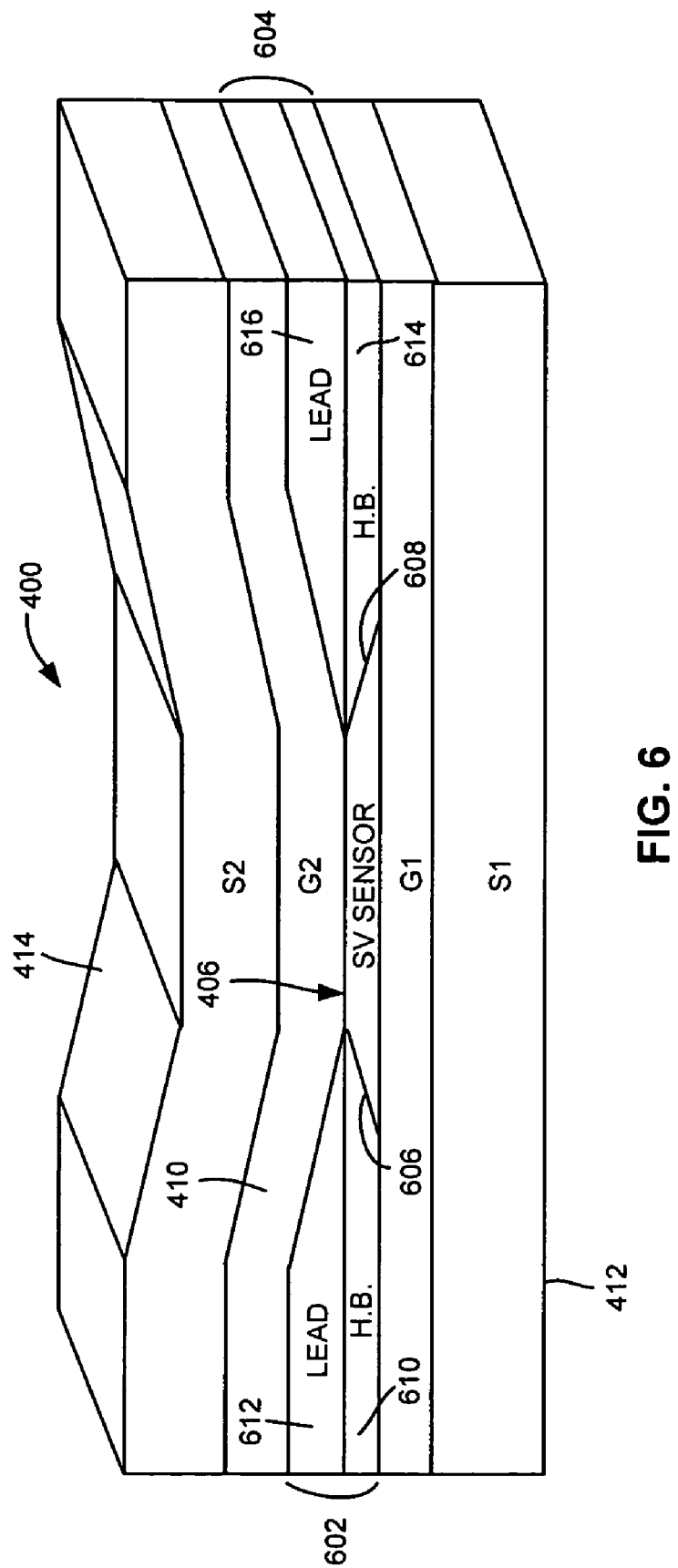
FIG. 6 is an enlarged isometric illustration, not to scale, of the read head with a spin valve sensor.

FIG. 6 is an enlarged isometric ABS illustration of the read head 400 shown in FIG. 4. The read head 400 includes the spin valve sensor 406. First and second hard bias and lead layers 602 and 604 are connected to first and second side edges 606 and 608 of the spin valve sensor. This connection is known in the art as a contiguous junction and is fully described in U.S. Pat. No. 5,018,037 which is incorporated by reference herein. The first hard bias and lead layers 602 include a first hard bias layer 610 and a first lead layer 612 and the second hard bias and lead layers 604 include a second hard bias layer 614 and a second lead layer 616. The hard bias layers 610 and 614 cause magnetic fields to extend longitudinally through the spin valve sensor 406 for stabilizing the magnetic domains therein. The spin valve sensor 406 and the first and second hard bias and lead layers 602 and 604 are located between the nonmagnetic electrically insulative first and second read gap layers 408 and 410. The first and second read gap layers 408 and 410 are, in turn, located between the ferromagnetic first and second shield layers 412 and 414.

The present invention provides a new magnetic tunnel junction (MTJ) sensor structure having a thinner profile, making it suitable for use in modern storage systems. In the following description, the width of the layers (W) refers to the track width. The sensor height is in a direction into the face of the paper. Unless otherwise described, thicknesses of the individual layers are taken perpendicular to the plane of the associated layer and parallel to the ABS, and are provided by way of example only and may be larger and/or smaller than those listed. Similarly, the materials listed herein are provided by way of example only, and one skilled in the art will understand that other materials may be used without straying from the spirit and scope of the present invention.

Figure 7:
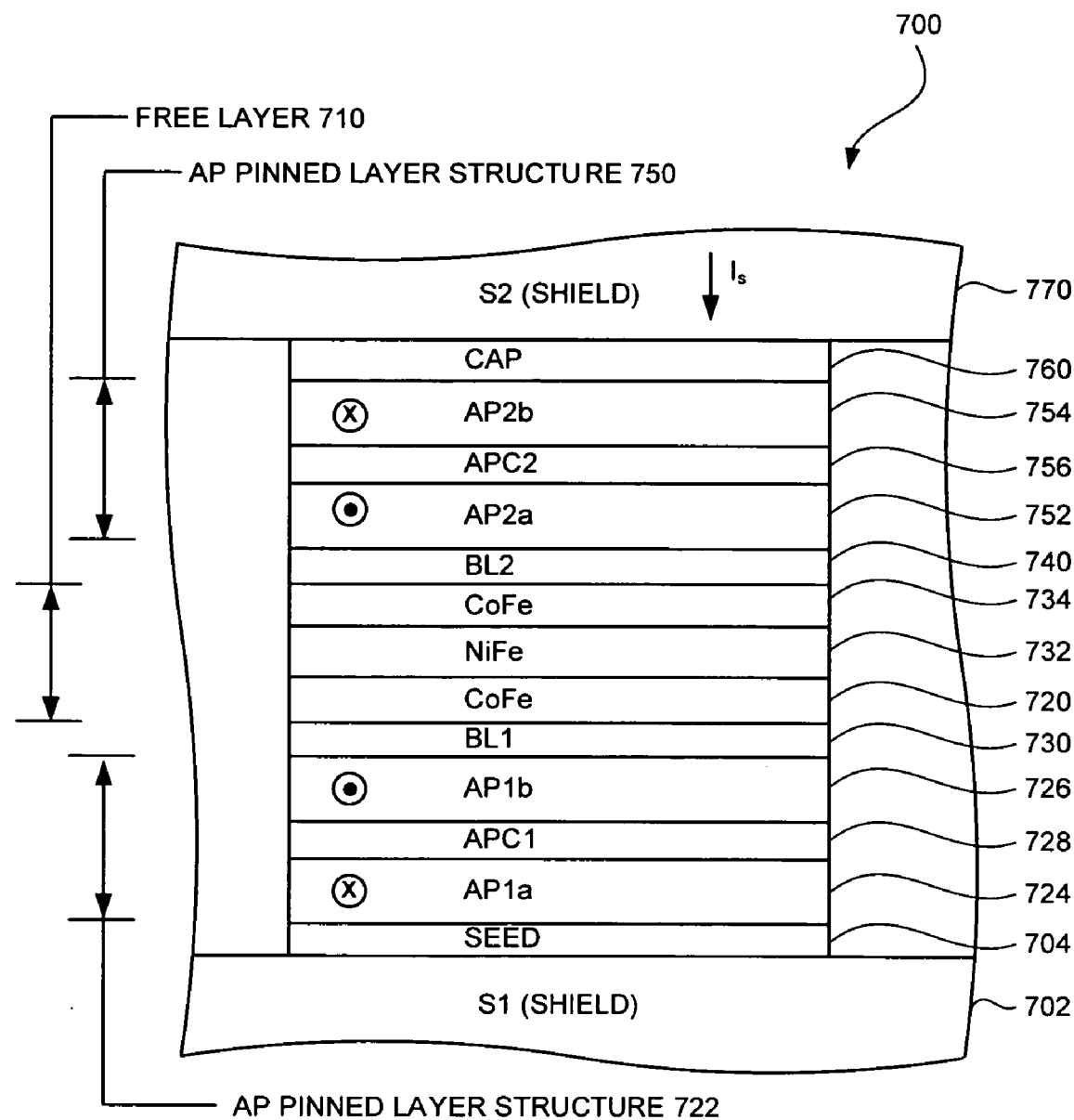
FIG. 7 is an ABS illustration of a CPP tunnel valve sensor, not to scale, according to an embodiment of the present invention.

FIG. 7 shows an air bearing surface (ABS) view, not to scale, of a dual magnetic tunnel junction (MTJ) sensor 700 according to a preferred embodiment of the present invention. As shown in FIG. 7, a first shield layer (S1) 702 is formed on a substrate (not shown). The first shield layer 702 can be of any suitable material, such as permalloy (NiFe).

Seed layers 704 are formed on the first shield layer 702. The seed layers 704 aid in creating the proper growth structure of the layers above them. Illustrative materials formed in a stack from the first shield layer 702 are a layer of Ta and a layer of NiFeCr. Illustrative thicknesses of these materials are Ta (30 Å), NiFeCr (20 Å). Note that the stack of seed layers 704 can be varied, and layers may be added or omitted based on the desired processing parameters.

Then a first antiparallel (AP) pinned layer structure 722 is formed above the seed layers 704. As shown in FIG. 7, first and second AP pinned magnetic layers, (AP1$a$) and (AP1$b$) 724, 726, are separated by a thin layer of an antiparallel coupling (APC1) material 728 such that the magnetic moments of the AP pinned layers 724, 726 are self-pinned antiparallel to each other. The pinned layers 724, 726 have a property known as magnetostriction. The magnetostriction of the pinned layers 724, 726 is very positive. The sensor 700 is also under compressive stresses because of its geometry at the ABS, and the configuration of the layer is such that it produces very large compressive stress. The combination of positive magnetostriction and compressive stress causes the pinned layers 724, 726 to develop a magnetic anisotropy that is in a perpendicular direction to the track width. This magnetic coupling through the AP coupling material 728 causes the pinned layers 724, 726 to have antiparallel-oriented magnetizations.

In the embodiment shown in FIG. 7, the preferred magnetic orientation of the pinned layers 724, 726 is for the first pinned layer 724, into the face of the structure depicted (perpendicular to the ABS of the sensor 700), and out of the face for the second pinned layer 726. Illustrative materials for the AP pinned layers 724, 726 are NiFe, CoFe$_{10}$ (90% Co, 10% Fe), CoFe$_{50}$ (50% Co, 50% Fe), etc. Illustrative thicknesses of the AP pinned layers 712, 714 are between about 10 Å and 30 Å. The AP coupling layer 728 can be formed of Ru at a thickness about 5-15 Å, but is preferably selected to provide a saturation field above about 10 KOe. In a preferred embodiment, each of the AP pinned layers 724, 726 is about 15 Å with an Ru layer 728 therebetween of about 8 Å.

In typical heads, the AP pinned layer structure 722 is stabilized by placement of an antiferromagnetic (AFM) layer adjacent the pinned layer structure 722. The AFM layer pins the AP pinned layer structure 722 so that the pinned layers 724, 726 do not move around when disk is reading data from disk, upon application of external magnetic fields, etc. However, as mentioned above, AFM layers are very thick, typically about 100-300 Å. If the designer wants to fit the sensor into small gap, use of thick AFM layers is not practical. The inventor has surprisingly found that the structure disclosed herein provides a stable structure, yet at a much reduced overall thickness.

A first barrier layer (BL1) 730 is formed of a dielectric barrier material, such as, Al$_2$O$_3$, AlO$_x$, MgO$_x$, etc. The barrier layer 730 is very thin such that the electric current passing through the sensor 700 "tunnels" through the spacer layer 730. An illustrative thickness of the barrier layer 730 is 3-6 Å.

A free layer (FL) 710 is formed above the first AP pinned layer structure 722. The magnetic moment of the free layer 710 is soft and so is susceptible to reorientation from external magnetic forces, such as those exerted by data on disk media. The relative motion of magnetic orientation of the free layer 710 when affected by data bits on disk media creates variations in the sensing current flowing through the sensor 700, thereby creating the signal. Preferred materials for the free layer 710 are a CoFe/NiFe/CoFe stack (FL1, FL2, FL3) 730, 732, 734 but can also be formed of a CoFe/Fe stack, a CoFe/NiFe/Fe stack, etc. An illustrative thickness of the free layer 710 is about 10-40 Å. However, the inventor has surprisingly found the that the sensor functions better as the free layer thickness is reduced. Thus, a preferred thickness of the free layer is less than about 30 Å.

A second barrier layer (BL2) 740 is formed above the free layer 710. The second barrier layer 740 can be identical to the first barrier layer 730, or can have a different thickness, composition, etc.

A second AP pinned layer structure 750, having AP pinned layers (AP2a, AP2b) 752, 754 and an antiparallel coupling layer (APC2) 756, is formed above the second barrier layer 740. The second AP pinned layer structure 750 is preferably substantially identical to the first AP pinned layer structure 722, but can have a different thickness, composition, etc. as long as stability is maintained. In a preferred embodiment, the magnetic thicknesses of the first and second AP pinned layer structures 722, 750 are about equal.

A cap (CAP) 760 is formed above the second AP pinned layer structure 750. Exemplary materials for the cap 760 are Ta, Ta/Ru stack, etc. An illustrative thickness of the cap 760 is 20-40 Å.

A second shield layer (S2) 770 is formed above the cap 760. An insulative material 772 such as $Al_2O_3$ is formed on both sides of the sensor 700.

Because AFM layers are not necessary, the sensor 700 thickness is substantially reduced compared to prior art double tunnel junction heads. Particularly, the sensor 700 can be successfully formed at a thickness of less than about 500 Å, more preferably less than about 300 Å, as measured between the shields 702, 770. Even thinner structures can be formed, such as the following sensor structure having a total thickness of 203 Å: Seed(40 Å)/CoFe(18 Å)/Ru(8 Å)/CoFe(18 Å)/$AlO_x$(5 Å)/[CoFe/NiFe/CoFe](25 Å)/$AlO_x$(5 Å)/CoFe(18 Å)/Ru(8 Å)/CoFe(18 Å)/Cap(40 Å).

Also, because the sensor 700 includes a double tunnel junction, larger voltages can be used for the sensing curent. For example, in a single tunnel junction, when voltage is applied, the basic magnetoresistance begins to drop. At some voltage, the MR signal goes to $V_{1/2}$, also known as the half voltage. However, in the present structure, the double junction half-voltage is four times the half-voltage of a single junction. Thus, the sensor 700 is more robust, as more voltage can be applied. The output signal is proportional to voltage, so the sensor 700 described herein provides about four times the signal.

The MTJ sensor 700 can be fabricated in an integrated ion beam/DC magnetron sputtering system to sequentially deposit the multilayer structure shown in FIG. 7. The barrier layers 730, 740, when formed from AlOx, can be formed by depositing an aluminum (Al) film with DC-magnetron sputtering from a pure Al target in an argon gas of 3 mTorr, and then exposing to an oxygen gas of 2 Torr for about 4 minutes. This optimum in situ oxidation is incorporated into this Al—O formation process for attaining a high tunneling magnetoresistance and low junction resistance.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A dual magnetic tunnel junction head, comprising:
   a free layer;
   first and second antiparallel (AP) pinned layer structures positioned on opposite sides of the free layer, each of the AP pinned layer structures including at least two pinned layers having magnetic moments that are self-pinned antiparallel to each other, the pinned layers being separated by an AP coupling layer;
   a first barrier layer formed of a dielectric barrier material and positoned between the first AP pinned layer structure and the free layer;
   a second barrier layer formed of a dielectric barrier material and positioned between the second AP pinned layer structure and the free layer;
   wherein the head does not have an antiferromagnetic layer.

2. A head as recited in claim 1, wherein the free layer includes a layer of NiFe.

3. A head as recited in claim 2, wherein the free layer further includes layers of CoFe sandwiching the layer of NiFe.

4. A head as recited in claim 1, wherein the AP pinned layer-structures have about the same magnetic thickness, and the free layer has a thickness of less than 30 Å.

5. A head as recited in claim 1, wherein the free layer has a thickness of less than 30 Å.

6. A head as recited in claim 1, wherein the free layer has a thickness of between about 15 and 25 Å.

7. A head as recited in claim 1, wherein a half voltage of the head is more than two times greater than a half voltage of a head having a substantially similar structure but having only one barrier layer.

8. A head as recited in claim 1, wherein the barrier layers are sufficiently thin such that tunneling of charge carriers occurs between adjacent layers.

9. A head as recited in claim 1, wherein the head has a thickness of less than about 300 Å.

10. A dual magnetic tunnel junction head, comprising:
    a free layer;
    first and second antiparallel (AP) pinned layer structures positioned on opposite sides of the free layer, each of the AP pinned layer structures including at least two pinned layers having magnetic moments that are self-pinned antiparallel to each other, the pinned layers being separated by an AP coupling layer;
    a first barrier layer formed of a dielectric barrier material and positioned between the first AP pinned layer structure and the free layer;
    a second barrier layer formed of a dielectric barrier material and positioned between the second AP) pinned layer structure and the free layer;
    wherein the head is a current perpendicular to plane head.

11. A head as recited in claim 10, wherein the free layer includes a layer of NiFe.

12. A head as recited in claim 11, wherein the free layer further includes layers of CoFe sandwiching the layer of NiFe.

13. A head as recited in claim 10, wherein the AP pinned layer structures have about the same magnetic thickness, and the free layer has a thickness of less than 30 Å.

14. A head as recited in claim 10, wherein the free layer has a thickness of less than 30 Å.

15. A head as recited in claim 10, wherein the barrier layers are sufficiently thin such that tunneling of charge carriers occurs between adjacent layers.

16. A head as recited in claim 10, wherein a half voltage of the head is more than two times greater than a half voltage of a head having a substantially similar structure but having only one barrier layer.

17. A head as recited in claim 10, wherein the head has a thickness of less than about 300 Å.

18. A head as recited in claim 10, wherein the head does not have an antiferromagnetic layer.

19. A magnetic storage system, comprising:

magnetic media;

at least one head for reading from and writing to the magnetic media, each head having;

a sensor having the structure recited in claim 1, wherein the head has a thickness of less than about 300 Å.

a writer coupled to the sensor;

a slider for supporting the head; and a control unit coupled to the head for controlling operation of the head.

20. A magnetic storage system, comprising:

magnetic media;

at least one head for reading from and writing to the magnetic media, each head having;

a sensor having the structure recited in claim 10, wherein the head has a thickness of less than about 300 Å.

a writer coupled to the sensor;

a slider for supporting the head; and a control unit coupled to the head for controlling operation of the head.

\* \* \* \* \*

UNITED STATES PATENT AND TRADEMARK OFFICE
CERTIFICATE OF CORRECTION

PATENT NO. : 7,283,333 B2
APPLICATION NO. : 10/777647
DATED : October 16, 2007
INVENTOR(S) : Gill It is certified that error appears in the above-identified patent and that said Letters Patent is hereby corrected as shown below:

In the claims:
col. 10, line 15 change "positoned between" to --positioned between--;
col. 10, line 56 change "second AP)" to --second AP--;
col. 11, line 16 change "each head having;" to --each head having:--;
col. 12, line 8 change "each head having;" to --each head having:--.

Signed and Sealed this

Eighth Day of April, 2008

JON W. DUDAS
*Director of the United States Patent and Trademark Office*